United States Patent
Yang et al.

(10) Patent No.: US 10,115,471 B1
(45) Date of Patent: Oct. 30, 2018

(54) STORAGE SYSTEM AND METHOD FOR HANDLING OVERHEATING OF THE STORAGE SYSTEM

(71) Applicant: Western Digital Technologies, Inc., Irvine, CA (US)

(72) Inventors: Nian Niles Yang, Mountain View, CA (US); Eran Erez, San Jose, CA (US); Zelei Guo, San Jose, CA (US); Dmitry Vaysman, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/583,738

(22) Filed: May 1, 2017

(51) Int. Cl.
*G11C 16/10* (2006.01)
*G11C 16/30* (2006.01)

(52) U.S. Cl.
CPC .............. *G11C 16/30* (2013.01); *G11C 16/10* (2013.01)

(58) Field of Classification Search
CPC ................................ G11C 16/10; G11C 16/26
USPC ........................................ 365/185.18, 185.24
See application file for complete search history.

(56) References Cited

U.S. PATENT DOCUMENTS

| | | | | |
|---|---|---|---|---|
| 7,620,826 B2 * | 11/2009 | Huang | ...................... | G06F 1/206 702/60 |
| 7,681,053 B2 * | 3/2010 | Johns | ...................... | G01K 3/005 700/299 |
| 7,721,128 B2 * | 5/2010 | Johns | ...................... | G01K 3/005 713/322 |
| 8,255,721 B2 * | 8/2012 | Rothman | .............. | G06F 1/3206 713/322 |
| 8,301,873 B2 * | 10/2012 | Chiu | ........................ | G06F 1/206 710/260 |
| 9,245,642 B1 * | 1/2016 | Chen | ................... | G11C 16/3427 |
| 9,436,628 B2 * | 9/2016 | Vaishampayan | ........ | G06F 1/206 |
| 9,459,680 B2 * | 10/2016 | Kim | ...................... | G06F 1/3206 |
| 9,575,537 B2 * | 2/2017 | Ignowski | ................ | G06F 1/206 |
| 9,620,996 B2 * | 4/2017 | Zeine | ....................... | H02J 50/20 |
| 9,658,678 B2 * | 5/2017 | Shoemaker | ........... | G06F 1/3275 |
| 9,746,383 B2 * | 8/2017 | Hsu | ........................... | G06F 1/206 |
| 2001/0021217 A1 * | 9/2001 | Gunther | ................. | G01K 7/015 374/178 |
| 2005/0105367 A1 * | 5/2005 | Kim | ......................... | G11C 5/14 365/226 |
| 2006/0140041 A1 * | 6/2006 | Vassighi | ................ | G11C 29/02 365/230.06 |
| 2006/0242447 A1 * | 10/2006 | Radhakrishnan | ....... | G06F 1/206 713/501 |
| 2007/0045825 A1 * | 3/2007 | Chan | ......................... | G06F 1/26 257/723 |
| 2007/0191993 A1 * | 8/2007 | Wyatt | ...................... | G11C 5/00 700/299 |

(Continued)

Primary Examiner — Michael Tran
(74) Attorney, Agent, or Firm — Brinks Gilson & Lione (57) ABSTRACT

A storage system and method for handling overheating of the storage system are disclosed. The method comprises determining whether a temperature sensed by a temperature sensor is above a first threshold temperature; and in response to determining that the temperature sensed by the temperature sensor is above the first threshold temperature, lowering a voltage supplied by a power supply to one or more components in the storage system comprising transistors, wherein lowering the voltage supplied to the one or more components reduces temperature by reducing leakage current of the transistors.

12 Claims, 9 Drawing Sheets

(56) References Cited

U.S. PATENT DOCUMENTS

| | | | |
|---|---|---|---|
| 2007/0260894 A1* | 11/2007 | Aguilar, Jr. | G06F 1/206 713/300 |
| 2008/0007319 A1* | 1/2008 | Cox | G01K 7/425 327/512 |
| 2010/0110818 A1* | 5/2010 | Mori | G11C 7/04 365/222 |
| 2011/0093132 A1* | 4/2011 | Tan | G06F 1/206 700/299 |
| 2012/0020157 A1* | 1/2012 | Lee | G11C 16/0433 365/185.05 |
| 2012/0126879 A1* | 5/2012 | Sandhu | H03K 17/145 327/427 |
| 2012/0200336 A1* | 8/2012 | Ramaraju | H03K 19/0008 327/512 |
| 2012/0323382 A1* | 12/2012 | Kamel | G05F 1/66 700/286 |
| 2013/0043927 A1* | 2/2013 | Penzes | H03K 3/0315 327/512 |
| 2014/0183957 A1* | 7/2014 | Duchesneau | F01K 13/006 307/64 |
| 2015/0185088 A1* | 7/2015 | Rabieirad | A61B 5/01 374/122 |
| 2016/0162219 A1* | 6/2016 | Erez | G06F 3/0653 711/103 |
| 2016/0260473 A1* | 9/2016 | Fukuda | G11C 11/419 |
| 2017/0019972 A1* | 1/2017 | Kimura | H01L 28/20 |
| 2017/0169867 A1* | 6/2017 | Desai | G11C 7/12 |
| 2017/0177218 A1* | 6/2017 | Kanno | G06F 3/061 |
| 2017/0288531 A1* | 10/2017 | Ribeiro Do Nascimento | H02M 3/07 |
| 2018/0120871 A1* | 5/2018 | Santos | G05D 23/19 |

\* cited by examiner

STORAGE SYSTEM AND METHOD FOR HANDLING OVERHEATING OF THE STORAGE SYSTEM

BACKGROUND

Memory in a storage system (e.g., a solid state drive (SSD)) can experience thermal instability in a variety of situations. For example, high ambient temperature, data traffic, and workload, as well as the enclosure build of the storage system, can have a detrimental impact on the storage system's hardware. Components in the storage system, such as the memory array, the controller, or application-specific integrated circuits (ASICs), can malfunction under sustained thermal stress, which can lead to data integrity and system reliability failures, as well as a high-defective-parts-per-million (DPPM) number. Some storage systems use thermal throttling in an attempt to handle the overheating problem. With thermal throttling, when the temperature of the storage system is above a certain threshold, the storage system can reduce the number of memory operations performed over a given time by, for example, slowing down the system clock or limiting the power or memory allocated to upcoming operations.

DETAILED DESCRIPTION

Overview

By way of introduction, the below embodiments relate to a storage system and method for handling overheating of the storage system. In one embodiment, a method is provided that is performed in a storage system comprising a memory, a temperature sensor, and a power supply. The method comprises determining whether a temperature sensed by the temperature sensor is above a first threshold temperature; and in response to determining that the temperature sensed by the temperature sensor is above the first threshold temperature, lowering a voltage supplied by the power supply to one or more components in the storage system comprising transistors, wherein lowering the voltage supplied to the one or more components reduces temperature by reducing leakage current of the transistors.

In some embodiments, the method further comprises lowering the voltage supplied by the power supply to additional components in the storage system comprising transistors until the temperature sensed by the temperature sensor is lower than the first threshold temperature.

In some embodiments, the method further comprises prior to lowering the voltage supplied by the power supply: determining whether the temperature sensed by the temperature sensor is above a second threshold temperature, wherein the second threshold temperature is lower than the first threshold temperature; and in response to determining that the temperature sensed by the temperature sensor is above the second threshold temperature, performing a thermal throttling operation on the memory.

In some embodiments, the one or more components comprising one or more of the following: the memory, a controller, a random access memory, and analog circuitry.

In some embodiments, the memory comprises a three-dimensional memory.

In some embodiments, the storage system is embedded in a host.

In some embodiments, the storage system is removably connected to a host.

In another embodiment, a storage system is provided comprising a memory; means for determining whether a temperature in the storage system is greater than a first temperature; and means for in response to determining that the temperature in the storage system is greater than a first temperature, lowering a voltage supplied to at least one transistor-based component in the storage system, wherein lowering the voltage supplied to the at least one transistor-based component in the storage system reduces the temperature in the storage system by reducing transistor leakage current.

In some embodiments, the storage system further comprises means for lowering the voltage supplied to the memory to a voltage needed to execute a particular memory operation.

In some embodiments, the storage system further comprises means for prior to lowering the voltage supplied to the at least one transistor-based component in the storage system: determining whether the temperature in the storage system is greater than a second temperature, wherein the second temperature is lower than the first temperature; and in response to determining that the temperature in the storage system is greater than the second temperature, performing a thermal throttling operation on the memory.

In some embodiments, the at least one transistor-based component in the storage system comprising one or more of the following: the memory, a controller, a random access memory, and analog circuitry.

In some embodiments, the memory comprises a three-dimensional memory.

In some embodiments, the storage system is embedded in a host.

In some embodiments, the storage system further comprises the storage system is removably connected to a host.

In another embodiment, a storage system is provided comprising a memory; a power supply; and a controller in communication with the memory and the power supply. The controller is configured to: determine how much voltage is required to execute a memory operation; compare the voltage required to execute the memory operation to a voltage currently being supplied from the power supply to the memory; in response to the voltage required to execute the memory operation being lower than the voltage currently being supplied from the power supply to the memory, lower the voltage being supplied from the power supply to the memory to match the voltage required to execute the memory operation; and in response to the voltage required to execute the memory operation being greater than the voltage currently being supplied from the power supply to the memory, delay execution of the memory operation until the voltage being supplied from the power supply to the memory increases to the voltage required to execute the memory operation.

In some embodiments, the controller comprises: a current projector configured to determine an amount of current that will be consumed in executing the memory operation; and a voltage-goal-per-current-lookup structure configured to determine how much voltage is required to execute the memory operation based on the amount of current determined by the current projector.

In some embodiments, the controller comprises: a current projector configured to determine an amount of current that will be consumed in executing the memory operation; and a voltage-goal-per-current-per-temperature-lookup structure configured to determine how much voltage is required to execute the memory operation based on the amount of current determined by the current projector and based on a temperature of the storage system.

In some embodiments, the storage system further comprises a voltage adjuster in communication with the power supply and the controller, wherein the voltage adjuster is configured to adjust the voltage supplied to the memory by the power supply in accordance with an instruction from the controller.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Embodiments

Figures 1A, 1B:
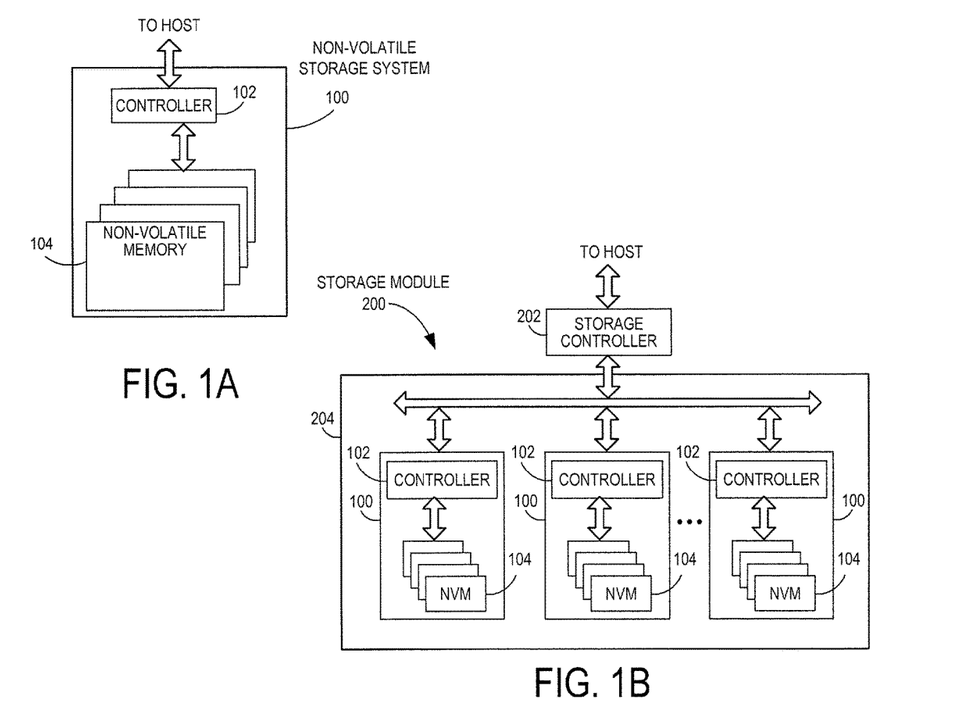
FIG. 1A is a block diagram of a non-volatile storage system of an embodiment.
FIG. 1B is a block diagram illustrating a storage module of an embodiment.
Figure 1C:
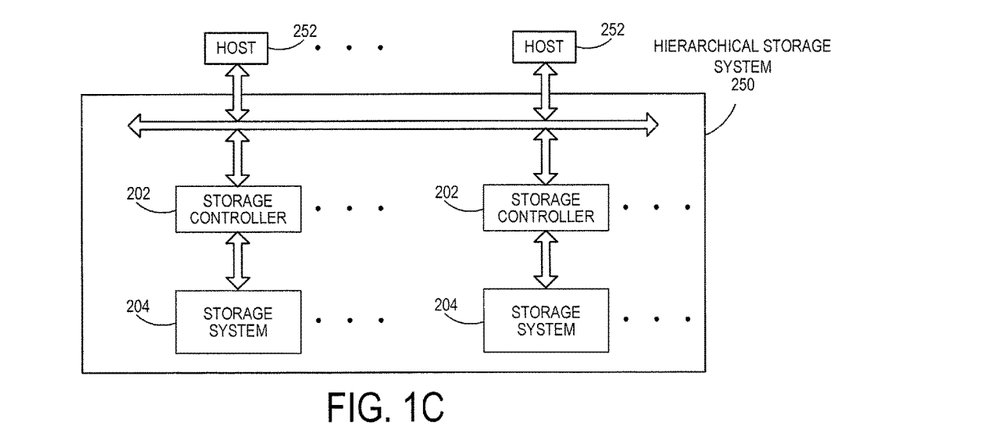
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
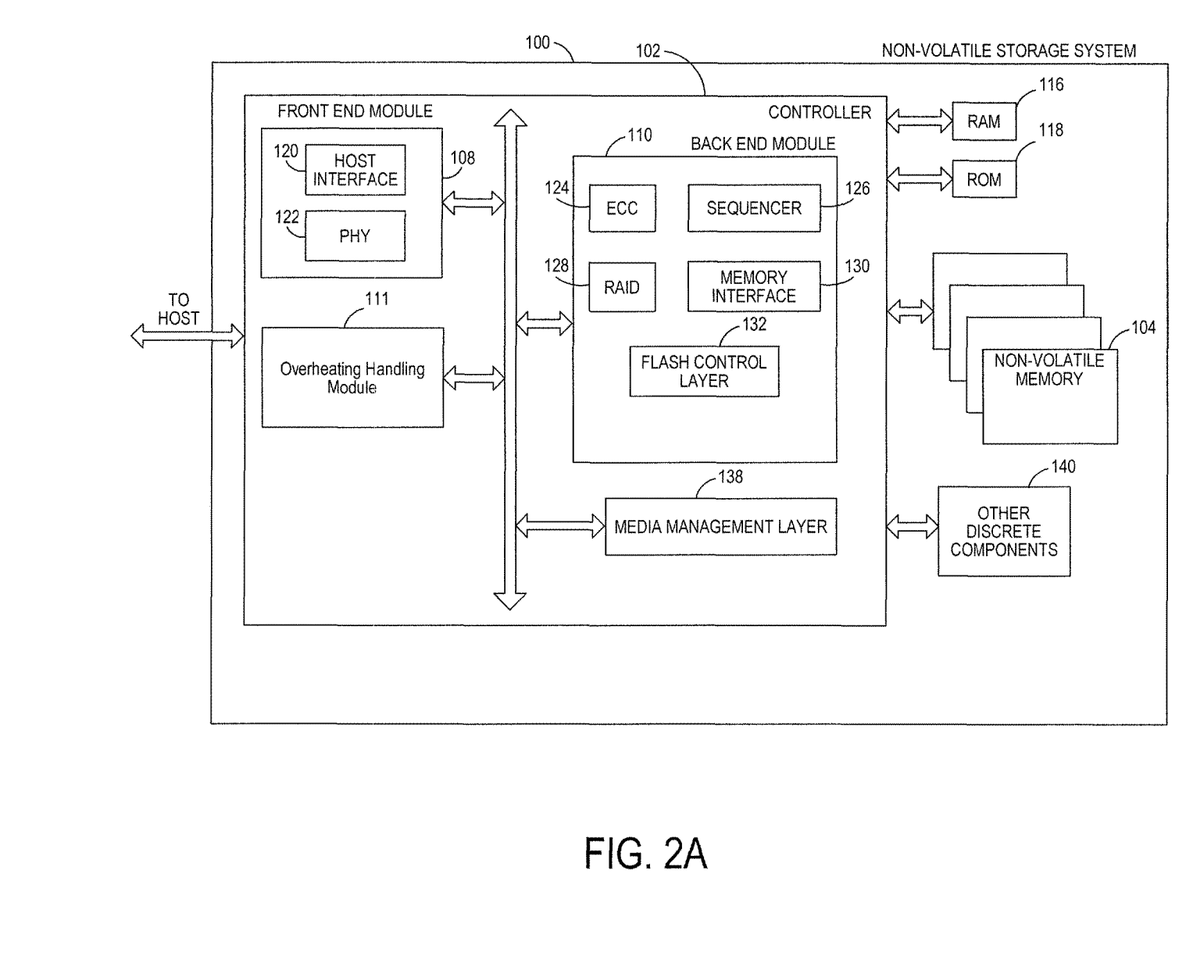
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include an overheating handling module 111, which is discussed in more detail below, and can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
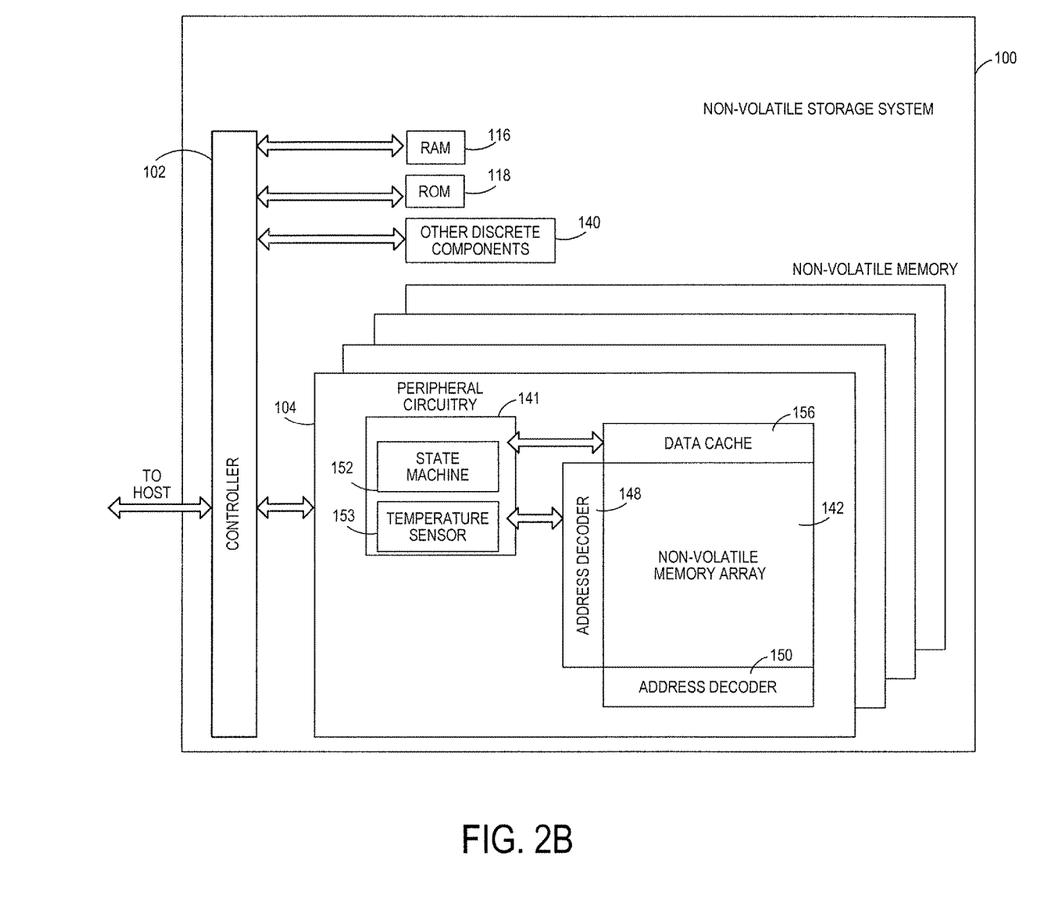
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102 and a temperature sensor 153 that can detect the temperature of the memory. Any suitable technology can be used to implement the temperature sensor 153, including technology currently employed in conventional memory temperature sensors. Also, it should be noted that while the temperature sensor 153 is located in the memory die 104 in this embodiment, the temperature sensor 153 can be located in another component in the storage system 100, such as the controller 102, or can be a separate component in the storage system 100.

As noted above, memory in a storage system can experience thermal instability in a variety of situations. For example, high ambient temperature, data traffic, and workload, as well as the enclosure build of the storage system, can have a detrimental impact on the storage system's hardware. Components in the storage system, such as the memory array, the controller, or application-specific integrated circuits (ASICs), can malfunction under sustained thermal stress, which can lead to data integrity and system reliability failures, as well as a high-defective-parts-per-million (DPPM) number.

Some storage systems use thermal throttling in an attempt to handle the overheating problem. With thermal throttling, when the temperature of the storage system is above a certain threshold, the storage system can reduce the number of memory operations performed over a given time by, for example, slowing down the system clock or limiting the power or memory allocated to upcoming operations. So, depending on the target temperature to be achieved, these approaches to thermal throttling run the risk of degraded performance and severe temperature cross-effects on data written to the storage system.

Figure 3:
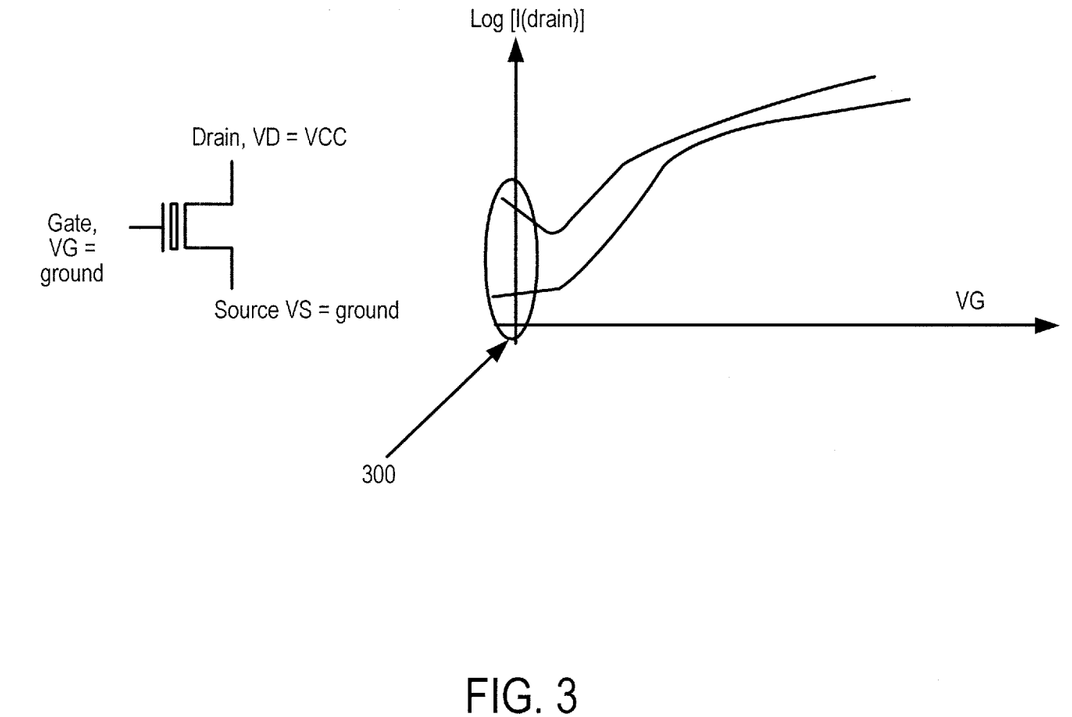
FIG. 3 is a graph showing leakage current of a transistor used in a storage system of an embodiment.

Further, while thermal throttling limits the number of memory operations that are performed in a given time (and, thus, the heat generated from performing those operations), thermal throttling does not address another, potentially greater, source of heat in the storage system: leakage current from transistors. Many components in the storage system 100 (e.g., memory cells in the memory array 104, the controller 102, random access memory 116, the ECC engine 124, a central processing unit (CPU)/processor, application-specific integrated circuits (ASICs), analog circuitry, etc.) contain transistors. As shown by the circle 300 in FIG. 3, even when the transistor is off/shut down (Vg=ground), current still flows through the transistor, and the amount of the transistor's leakage current is a function of a power supply, Vcc (which equals Vd in this example). The top curve represents a higher Vcc (Vd) supplied to the transistor, and the lower curve represents a lower Vcc. These curves are expressed by the following equation: I (drain leakage)=A× Exp(K*Vds)*Exp(S*Temperature), where A, K, S are coefficients from the material characterization, and Vds is the voltage drop from Vcc (which equals Vd in this situation) to Vs (which is ground in this situation). The transistor's leakage power is defined as: P (leakage)=I(leakage)*Vcc, or P=B*Vcc*Exp(K*Vcc)*Exp(S*Temperature).

In one embodiment, to reduce the transistor's leakage current, the storage system 100 reduces the voltage supply (Vcc) to one or more components in the storage system 100 that contain transistors. (The transistor's leakage current can also or instead be reduced by reducing temperature of the storage system 100 (e.g., with an external cooling device).) As can be seen from the graph in FIG. 3, because of the exponential relationship between Vcc and transistor leakage current, reducing the voltage even a little has a big effect on the current (and, therefore, heat generated by the storage system 100). That is, by reducing the power consumption caused by excessive leakage currents at high temperature, this embodiment can be used to handle thermal instability on different storage system components in order to prevent further thermal damage and, thus, stabilize the storage system's behavior. The embodiment will be discussed through an illustrative example shown in FIGS. 4-7.

Figure 4:
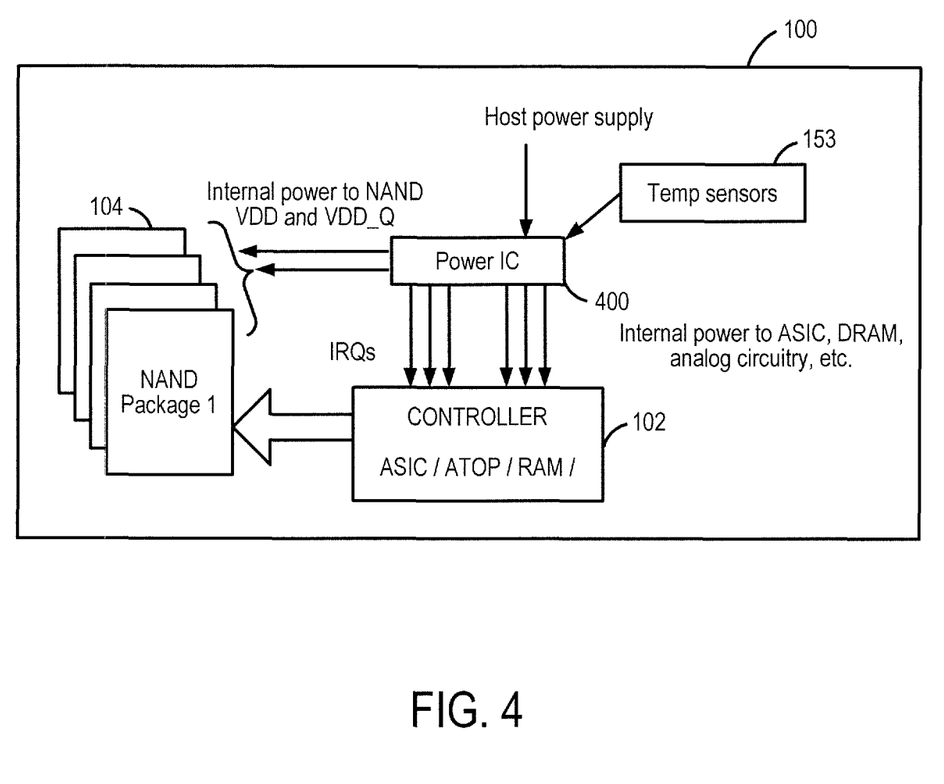
FIG. 4 is a block diagram of a memory system of an embodiment.

Turning first to FIG. 4, FIG. 4 shows another view of the storage system 100 of one embodiment. As shown in FIG. 4, the storage system 100 comprises a memory 104 (here, a plurality of NAND packages), a controller 102 (here, including an application-specific integrated circuit (ASIC), an analog "top" layer, and RAM), a power supply 400 (here, a power integrated circuit (IC)), and one or more temperature sensors 153 (which can be located anywhere in the storage system 100 (e.g., in the memory 104 or elsewhere)). The power supply 400 receives power from a host, regulates the power, and supplies it to the NAND dies 104 and to the controller ASIC 102

Figure 5:
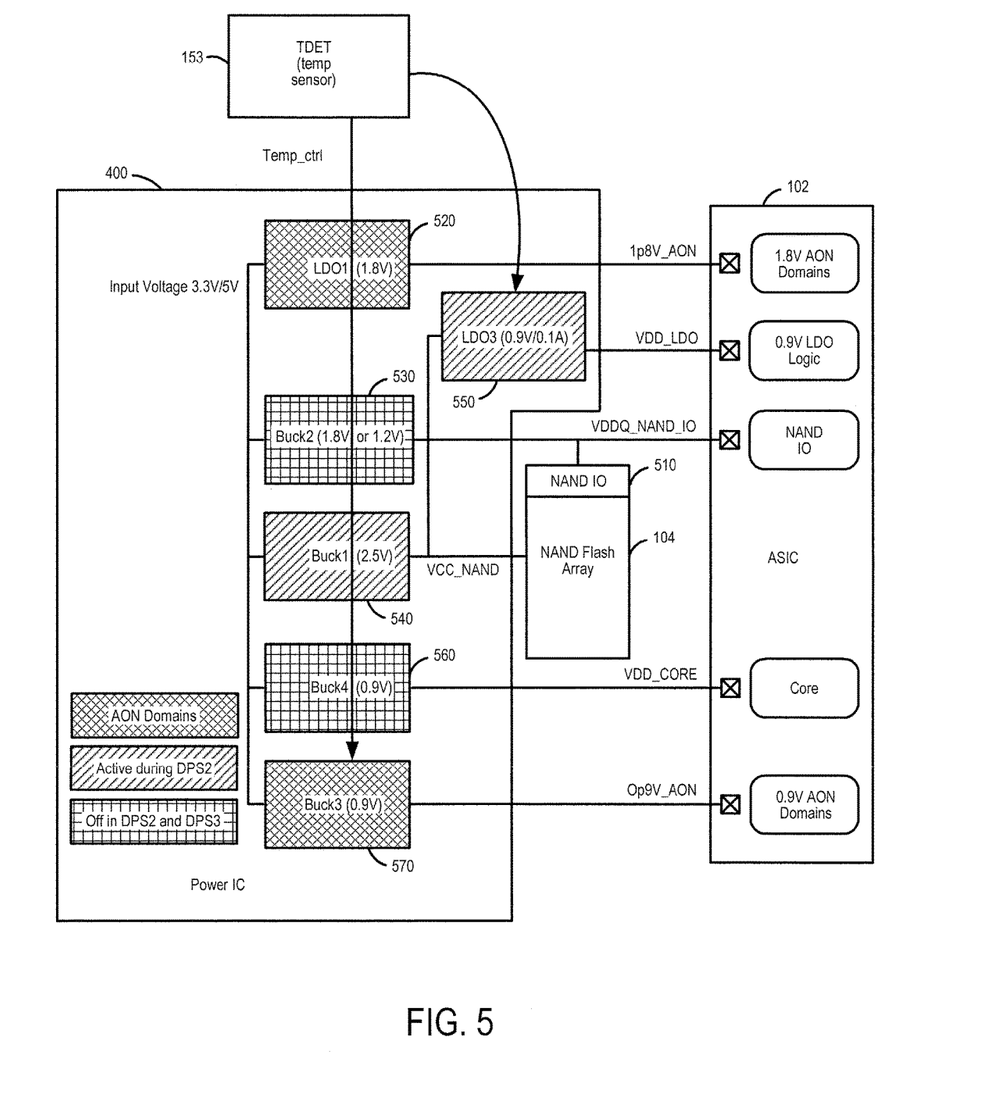
FIG. 5 is a block diagram of a power supply of an embodiment.

FIG. 5 is a block diagram showing the power supply 400 of one embodiment in more detail. It should be understood that FIG. 5 shows one implementation and that other implementations can be used. As shown in FIG. 5, in this embodiment, the power supply 400 comprises low-drop out (LDO) regulators 520, 550. The power supply 400 also comprises several buck converters 530, 540, 560, 570, which are DC-to-DC power converters that step down voltage. The output of LDO 520 is provided as input to a 1.8 V always-on domain of the controller ASIC 102, the output of LDO 550 is provided as input to 0.9V LDO logic circuitry of the controller ASIC 102, the output of buck 530 is provided as input to NAND IO on the controller ASIC 102 and on the memory die 104, the output of buck 540 is provided to the NAND die 104, the output of buck 560 is provided as input to the core of the controller ASIC 102, and the output of buck 570 is provided as input to the 0.9V always-on domain of the controller ASIC 102. As shown in FIG. 5, there are three power domains of the power supply 400 in this embodiment: always on, active during the DPS2 state, and off in the DPS2 and DPS3 states. The DPS2 state refers to an operating state in which the NAND 104 is on, but parts of the controller ASIC 102 may be off. This is a form of standby where the NAND 104 is still on. DPS3 refers to an operating state where all of the components are in standby mode.

The output voltage of the LDOs and bucks is a multiple of an internal reference voltage (e.g., 0.6 V) with a given ratio (R) (e.g., 1.8 V with R=3). In this embodiment, the temperature sensor 153 is in communication with the LDOs and bucks and provides a temperature control (Temp_ctrl) signal to those components. Those components can change the ratio R according to the Temp_cntl state (e.g., 1 or 0 for 2 states using one bit, 4 control states for 4 temperature zones using 2 bits, etc.). This is an implementation of the overheating handling module 111 mentioned above. In other embodiments, the temperature sensor 153 merely provide an indication of temperature, and the controller 102 or some other component makes the initial assessment as to whether the temperature is above a threshold.

This embodiment uses this ratio to handle overheating of the storage system 100. For example, when the temperature sensed by the temperature sensor 153 is above a first threshold temperature, the temperature sensor 153 can change the value of the Temp_cntl state from 0 to 1 (or vice versa), assuming a two-state implementation. When the controller 102 receives the Temp_cntl state, it determines that the temperature sensed by the temperature sensor is above the first threshold temperature, and changes the ratio (R) used by the LDOs and bucks to lower the voltage supplied by the power supply 400 to one or more components in the storage system 100 comprising transistors (e.g., output=R*(ref voltage). Lowering the voltage supplied to one or more components reduces temperature by reducing leakage current of the transistors. All of the LDOs and bucks can be responsive to the Temp_cntl state change, or logic can be put in place so that some (but not all) of the LDOs and/or bucks respond to the Temp_cntl state change at a given time. In this way, the power supply 400 can lower the voltage supplied to additional components, if needed.

Figure 6:
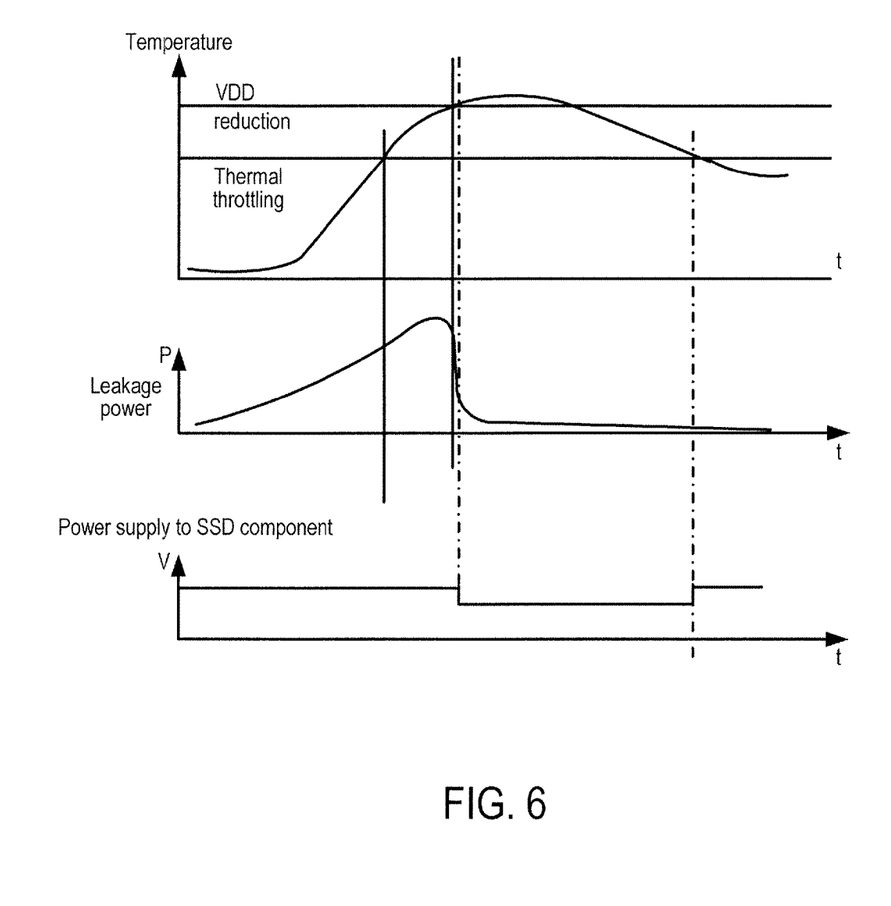
FIG. 6 are graphs of an embodiment showing temperature, power, and voltage over time.

The graphs in FIG. 6 illustrate these operations. With a certain, constant power supply, as leakage power increases, the temperature of the storage system 100 increases. When the temperature exceeds a certain threshold (indicated by the left-most vertical line), the storage system 100 enacts a thermal throttling procedure (e.g., reducing the number of operations performed over time) in an attempt to reduce the temperature. However, in this example, thermal throttling is not effective, and the temperature continues to rise. When the temperature exceeds another threshold (indicated by the middle vertical line), the storage system 100 reduces the power supplied to various components, which causes the leakage current to dramatically decrease (e.g., by 2-3 orders of magnitude because leakage current is a function of Vcc in an exponential fashion), which causes the temperature to drop. During this time, thermal throttling can continue to take place or may be foregone in favor of the reduced power supply approach. In any event, when the temperature falls below another threshold (indicated by the right-most vertical line), the power supply can be brought back to its previous level.

Figure 7:
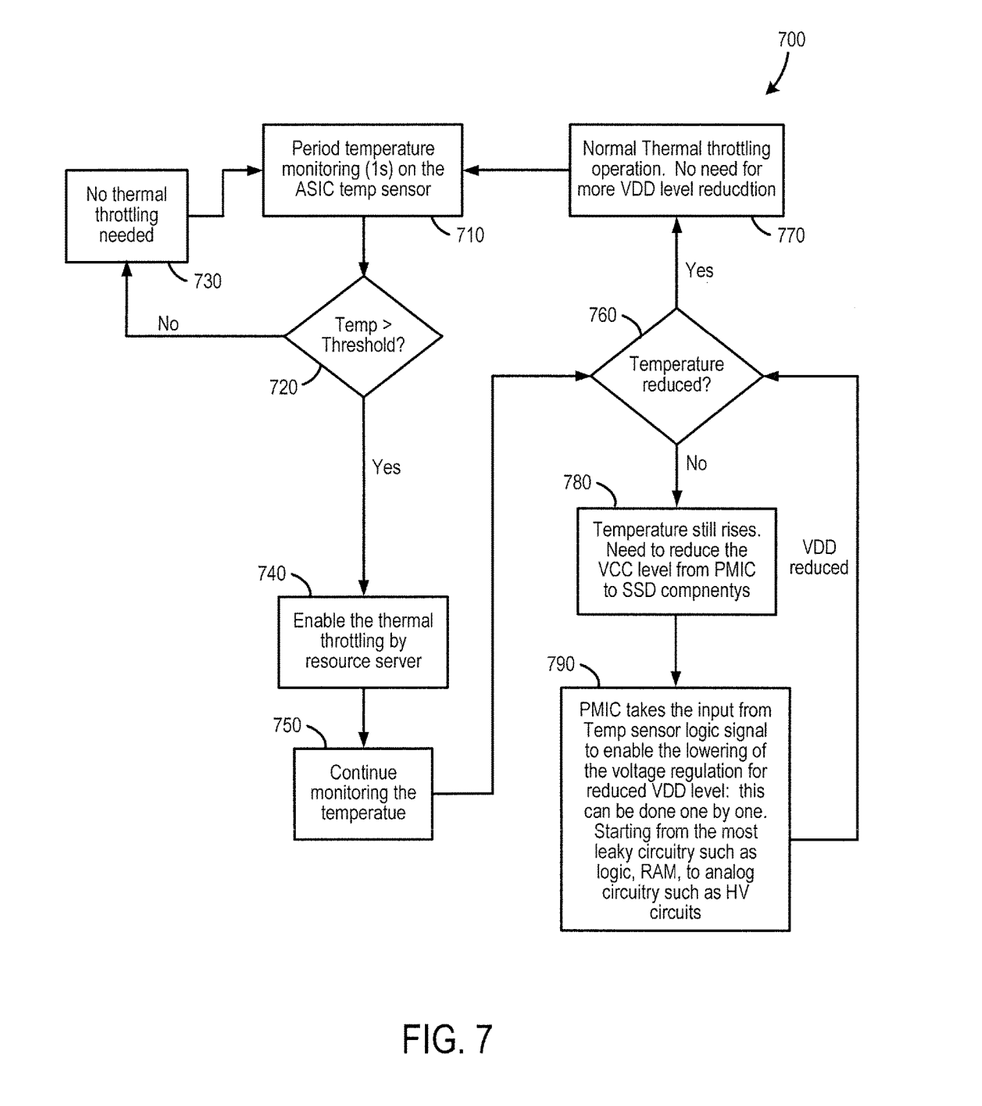
FIG. 7 is a flow chart of a method of an embodiment for handling overheating of a storage system.

FIG. 7 is a flow chart 700 that describes the acts in this example in more detail. As shown in FIG. 7, in this embodiment, there is periodic temperature monitoring (e.g., every one second) of the temperature sensor 153 (act 710). It is then determined whether the temperature is above a threshold (act 720). If it isn't, no thermal throttling is needed (act 730). If it is, the storage system 100 enables thermal throttling by the resource server (e.g., component(s) in the controller 102 that provided power tokens to maintain a power budget) (act 740) and continues to monitor the temperature (act 750). If the temperature has been reduced, the thermal throttling procedure was successful, and there is no need to reduce the power supplied to transistor-based components (act 770). However, if the temperature hasn't been reduced, the power supplied by the power supply 400 to the transistor-based components is reduced (e.g., from 3 V to 2.8 V) (act 780). As noted in act 790, this can be done on a component-by-component basis until the temperature is reduced.

In another embodiment, the storage system 100 provides dynamic workload-based voltage scaling. Storage system power rails (e.g., the Vdd lines from the power IC 400 to the NAND packages 104 in FIG. 4) are typically driven by on-board regulators, either discrete or integrated into a single IC (sometimes called power management IC or PMIC, for short). Voltage at the output of these regulators is set in such a way to sustain worst-case current consumption by the rail consumers. Rail consumers often have a minimum operating voltage. In order to maintain the minimum operating voltage, the regulator can be set with a margin, so that any instantaneous current draw would not pull the rail voltage below the minimum operating voltage. The voltage drop is proportional to the amount of instantaneous current consumption. The voltage margin amount is typically configured to sustain the largest voltage drop caused by the highest instantaneous current consumption.

Typically, power consumption is proportional to the power rail voltage. As such, in theory, the rail voltage level would be set as low as possible. However, in practice, since a storage system is often designed for a worst case scenario, a voltage margin is typically set larger than what is required. For example, for a 32 NAND die SSD, the worst-case assumption would be 32 NAND dies working simultaneously, although, in a typical case, only 8 of these NAND dies are working simultaneously. Alternatively, the regulation circuits can be "beefed up," meaning using a more-expensive regulator architecture and selecting large regulator capacitors, strong inductors, and large transistors, which will solidify the output voltage to enable a smaller margin. However, this solution comes with component cost and area. As another alternative, the nominal voltage can be bumped up (e.g., using 3.1 V to help ensure a minimum voltage of 2.9 V), but this may sacrifice system level power consumption and performance.

In one embodiment, these problems are addressed by dynamically adjusting the storage system rail voltage level based on projected instantaneous current consumption. Specifically, one implementation addresses the NAND core voltage rail as the NAND is a dominant consumer in an SSD application. It should be noted that while the below description discusses a specific application for NAND core voltage, other implementations can be used. In general, this embodiment, allows a memory operation only after it has been determined that the NAND voltage level is properly set to allow a correct NAND operation. This embodiment provides the advantage of reducing voltage levels to a minimum possible at potentially all times; hence, typically saving power. This embodiment will be discussed in more detail in conjunction with the block diagram for FIG. 8.

Figure 8:
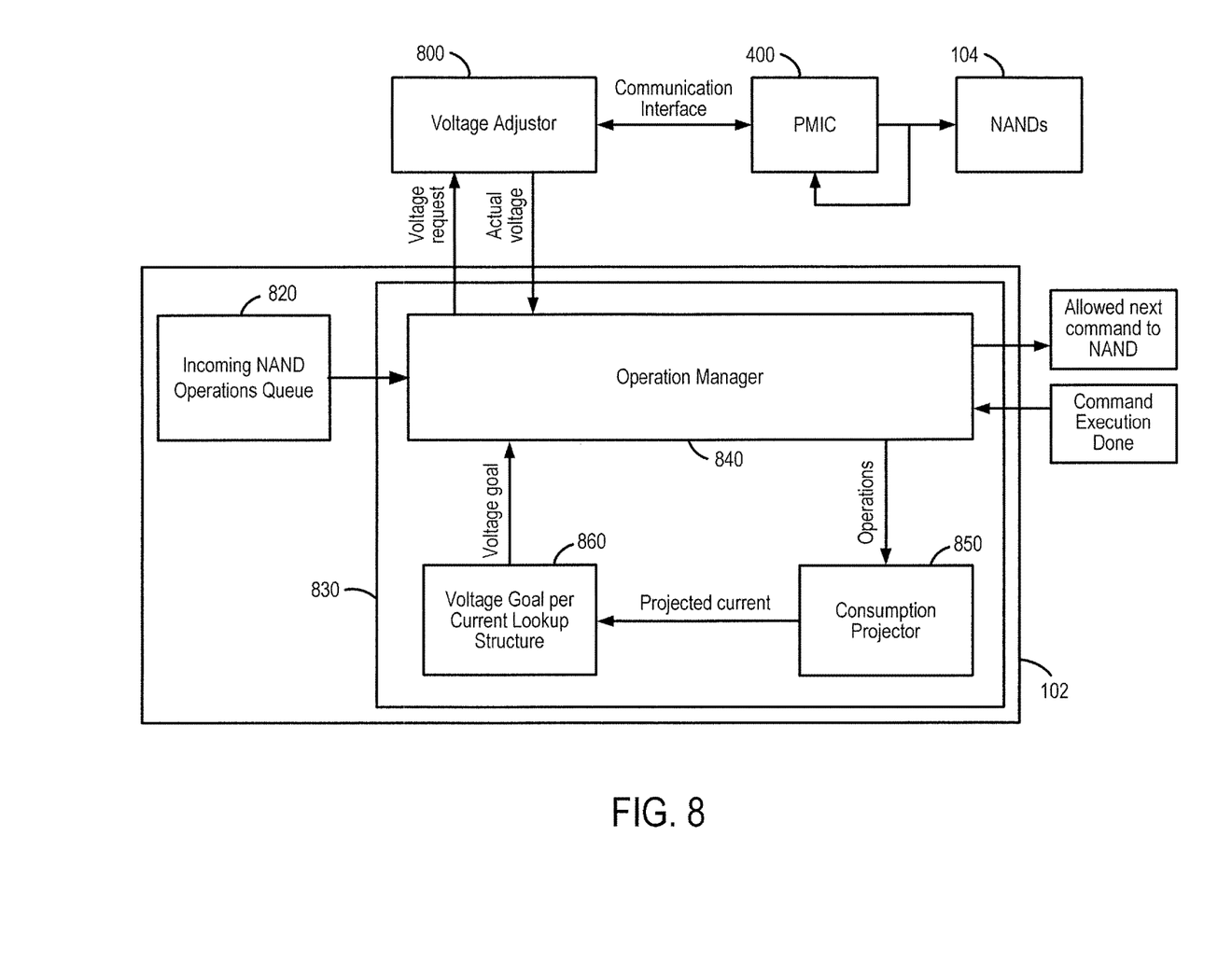
FIG. 8 is block diagram of a storage system of another embodiment.

As shown in FIG. 8, in this embodiment, in addition to the memory dies 104, power supply (power management integrated circuit (PMIC)) 400, and controller 102, this embodiment has a voltage adjustor 800. Also in this embodiment, the controller 102 has an incoming operations queue 820 and a resource server 830, which comprises an operation manager 840, a consumption projector 850, and a voltage goal per current lookup structure 860.

In general, the PMIC 400 is responsible for regulating voltage and has a communication interface with the voltage adjustor 800. The PMIC 400 may receive requested voltage instructions from the voltage adjustor 800 and may provide feedback indicating the requested voltage has been reached. The voltage adjustor 800 is an element that has an interface to the PMIC 400 and can adjust NAND rail voltage based on requested voltage from the operation manager 840. The voltage adjustor 800 has an output indicating the requested voltage was achieved, and this output provides feedback to the operation manager 840

In one embodiment, the operation manager 840 is an element that can allow or inhibit next NAND operation based on projected consumption vs. voltage setting and other conditions. The operation manager 840 is part of the resource server 830, which, as noted above, also comprises the consumption projector 850 and voltage goal per currently lookup structure 860. In this embodiment, the consumption projector 850 is an element that has the information about requested NAND rail consumption and can project the worst case instantaneous consumption based on this information at any time. When a new NAND operation is requested, the consumption projector 850 can add the request consumption to the total. When NAND operation completes, the consumption projector 850 can subtract the operation consumption from the total. The voltage goal per current lookup structure 860 is an element that maintains goal minimum voltage levels per different consumption levels.

In operation, when a new NAND operation request arrives or an existing operation completes, the operation manager 840 gets notified. The operation manager 840 uses the consumption projector to determine the upcoming instantaneous current consumption. The operation manager 840 then locates the current consumption level in the voltage goal per current lookup structure 860 and fetches the voltage level goal. The operation manager 840 compares the goal voltage level with requested voltage level. If the goal voltage level is lower than the requested voltage level, the requested voltage is updated to be the goal voltage level, and the voltage adjustor 800 is updated. If requested voltage level is lower than actual voltage level reported by the voltage adjustor 800, the operation manager 840 inhibits the new NAND operation until after the actual voltage level reaches the required level.

When a NAND operation completes, the resource server 830 reevaluates all conditions and may allow pending NAND operation if all conditions have been met accordingly. When command execution done, and there are no outstanding commands, the resource server 830 may set the voltage to its minimum value.

The communication interface between the PMIC 400 and voltage adjuster 800 can be implemented in any suitable way. In one embodiment, the communication interface is implemented with binary signals indicating the request. For example, a single signal can indicate a request to switch between two voltage levels. Alternatively, the communication interface can include several signals (e.g., 4 signals to convey requests to shift between 16 possible voltage levels). Alternatively, the communication interface can be an analog signal for requesting virtually unlimited voltage levels. As another alternative, the communication interface can be a communication bus (e.g., I2C to save signals and to request for virtually unlimited voltage settings).

In one embodiment, the voltage adjustor indication that voltage has reached requested level may be based on a predetermined timeout. For example, it may take the PMIC 400 a known amount of 70 us to reach a new voltage level. Alternatively, the PMIC 400 may monitor its output voltage to determine when the requested level has been reached. The PMIC 400 may have a feedback signal to the voltage adjustor 800 indicating the event upon occurrence. Alternatively, the voltage adjustor 800 can use a communication interface to request an update and inquire current voltage level.

The voltage goal per current lookup structure 860 can be set statically per device characterization. Alternatively, the SSD may go through training sequence in which multiple NAND operations are issued at different voltage levels and operations are inspected for pass or fail condition. The training process may be iterative starting with high voltage and reducing voltage gradually. When a first "fail" condition is reached, a good voltage level can be determined, and the lookup updated. This training process can be implemented at SSD production phase or even regularly throughout operation.

In an alternative embodiment, the structure 860 can be expanded to include temperature as part of the controlling factor. In one embodiment, the structure 860 is implemented as a three-dimensional table, where a voltage-per-current-per-temperature look-up is used to provide a different minimum voltage margin as a function of temperature of the storage system 100. In this way, when the temperature is higher than a threshold for thermal throttling, the voltage goal can be lowered to provide leakage reduction while still making the memory operational. In one embodiment, the structure 860 can have two mechanisms: (1) voltage adjustment as a function of current consumption (minimizing voltage margin at all times regardless of temperature) and (2) voltage adjustment as a function of temperature (minimizing voltage margin at high temperature). These two mechanisms can work independently. In general, mechanism (1) can allow for a lower voltage margin than mechanism (2) at light loads (e.g., at lower current consumption), and mechanism (1) can be used at high temperature, when minimizing voltage margin is most needed. Mechanism (1) can have some associated overhead that is worth incurring only under certain conditions.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method for handling overheating of a storage system, the method comprising:
performing the following in a storage system comprising a memory, a temperature sensor, a power supply, and a controller, wherein the controller comprises transistors:
executing first computer-readable program code by the controller to:
determine whether a temperature sensed by the temperature sensor is above a first threshold temperature by comparing the temperature sensed by the temperature sensor to the first threshold temperature; and
in response to determining that the temperature sensed by the temperature sensor is above the first threshold temperature, perform a thermal throttling operation to reduce a number of memory operations performed in the memory; and
executing second computer-readable program code by the controller to:
determine whether the thermal throttling operation was successful in lowering the temperature below the first threshold temperature by comparing a temperature sensed by the temperature sensor after performing the thermal throttling operation to the first threshold temperature; and
in response to determining that the thermal throttling operation was unsuccessful in lowering the temperature below the first threshold temperature, lower a voltage supplied by the power supply to the controller, wherein lowering the voltage supplied to the controller reduces temperature by reducing leakage current of the transistors in the controller.

2. The method of claim 1 further comprising lowering the voltage supplied by the power supply to another component that comprises transistors in the storage system until the temperature sensed by the temperature sensor is lower than the first threshold temperature.

3. The method of claim 1, wherein the controller comprises one or more of the following: a random access memory and analog circuitry.

4. The method of claim 1, wherein the memory comprises a three-dimensional memory.

5. The method of claim 1, wherein the storage system is embedded in a host.

6. The method of claim 1, wherein the storage system is removably connected to a host.

7. A storage system comprising:
a memory;
a temperature sensor;
a power supply;
a controller comprising transistors;
first computer-readable program code means for:
determining whether a temperature sensed by the temperature sensor is above a first threshold temperature by comparing the temperature sensed by the temperature sensor to the first threshold temperature; and
in response to determining that the temperature sensed by the temperature sensor is above the first threshold temperature, performing a thermal throttling operation to reducing a number of memory operations performed in the memory; and
second computer-readable program code means for:
determining whether the thermal throttling operation was successful in lowering the temperature below the first threshold temperature by comparing a temperature sensed by the temperature sensor after performing the thermal throttling operation to the first threshold temperature; and
in response to determining that the thermal throttling operation was unsuccessful in lowering the temperature below the first threshold temperature sensor, lowering a voltage supplied by the power supply to the controller, wherein lowering the voltage supplied to the controller reduces temperature by reducing leakage current of transistors in the controller.

8. The storage system of claim 7 further comprising:
means for reducing the voltage supplied to the memory to a voltage needed to execute a particular memory operation.

9. The storage system of claim 7, wherein the controller comprises one or more of the following: a random access memory and analog circuitry.

10. The storage system of claim 7, wherein the memory comprises a three-dimensional memory.

11. The storage system of claim 7, wherein the storage system is embedded in a host.

12. The storage system of claim 7, wherein the storage system is removably connected to a host.

* * * * *